(12) United States Patent
Kucharski

(10) Patent No.: US 8,004,854 B2
(45) Date of Patent: Aug. 23, 2011

(54) ELECTRICAL NOISE PROTECTION

(75) Inventor: Janusz M. Kucharski, Torrance, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 2158 days.

(21) Appl. No.: 10/056,270

(22) Filed: Jan. 24, 2002

(65) Prior Publication Data

US 2003/0137814 A1    Jul. 24, 2003

(51) Int. Cl.
  *H05K 7/02* (2006.01)
  *H05K 7/06* (2006.01)
  *H05K 7/08* (2006.01)
  *H05K 7/10* (2006.01)
(52) U.S. Cl. ......... 361/780; 361/782; 361/784; 361/794
(58) Field of Classification Search .......... 361/760–764, 361/792–795, 780–784, 816, 818; 333/12, 333/181–185; 174/35 R, 259–261; 257/700–704
See application file for complete search history.

(56) References Cited

U.S. PATENT DOCUMENTS

| | | | | |
|---|---|---|---|---|
| 4,904,968 A * | 2/1990 | Theus | ............................ | 333/246 |
| 5,719,750 A * | 2/1998 | Iwane | ............................ | 361/794 |
| 6,297,965 B1 * | 10/2001 | Sasaki et al. | .................... | 361/782 |
| 6,353,540 B1 * | 3/2002 | Akiba et al. | ..................... | 361/794 |
| 6,515,868 B1 * | 2/2003 | Sasaki et al. | .................... | 361/760 |

FOREIGN PATENT DOCUMENTS

JP        406069680 A  *  3/1994

* cited by examiner

*Primary Examiner* — Tuan T Dinh
(74) *Attorney, Agent, or Firm* — Fogg & Powers LLC

(57) ABSTRACT

Embodiments of the present invention provide an electronic device. The electronic device includes a circuit board. A first circuit is disposed on a first side of the circuit board. The first circuit is connected to a first ground plane of the circuit board. A second circuit is disposed on a second side of the circuit board. The second side is opposite the first side, and the second circuit is connected to a second ground plane of the circuit board. Moreover, the first and second ground planes respectively lie in different planes of the circuit board and are electrically interconnected by a conductive trace disposed within the circuit board.

24 Claims, 3 Drawing Sheets

ELECTRICAL NOISE PROTECTION

TECHNICAL FIELD

The present invention relates generally to the field of electronic circuits and, in particular, to protecting electronic circuits from noise.

BACKGROUND

Switch-mode power supplies are often used to provide a regulated DC voltage in computers, television receivers, battery chargers, etc. Switch-mode power supplies are typically smaller, lighter, and more efficient than linear power supplies, which are also commonly used to provide regulated DC voltages. A typical circuit for a switch-mode power supply includes a capacitor, an inductor (e.g., a primary winding of a transformer) and a switch, e.g., a transistor, such as a Metal Oxide Semiconductor Field Effect Transistor (MOSFET). These components are normally disposed on a single side of a circuit board, such as printed circuit board (PCB), and, in one configuration, are connected in series using, for example, electrically conducting traces to form a power loop. Another example of a power loop is a circuit including a secondary winding of a transformer, a rectifier (e.g., a diode or a MOSFET), and a capacitor connected in series.

When current flows in the power loop, the current flows from the capacitor, through the inductor, through the switch, and back to the capacitor. The switch is opened and closed at a high rate to produce a pulsed current flow in the loop. Moreover, additional circuitry, e.g., a control circuit for controlling the switch, is frequently disposed on the same side of the circuit board and is connected to the power loop using, for example, electrically conducting traces. The control circuit usually operates at substantially lower current levels than does the power loop and includes a number of sensitive inputs. Moreover, the control circuit is often located in close proximity to the power loop of the switch-mode power supply. In many instances, the control circuit and the power loop are connected to the same ground conductor on the circuit board. This frequently causes problems because the pulsed current flow in the power loop produces relatively high levels of noise in the ground conductor that frequently gets passed to the control circuit via the sensitive inputs.

Another problem is that the power loop acts as an antenna for transmitting the noise. Increasing the area enclosed by the power loop increases the noise transmission. Disposing the control circuit in proximity to the power loop on the same side of the circuit board can result in the control circuit being exposed to increased noise levels that interfere with the operation of the control circuit.

For the reasons stated above, and for other reasons stated below which will become apparent to those skilled in the art upon reading and understanding the present specification, there is a need in the art for switch-mode power supplies that are configured for protecting sensitive control circuitry from noise generated by the power loop within the switch-mode power supply.

SUMMARY

The above-mentioned problems with switch-mode power supplies and other problems are addressed by embodiments of the present invention and will be understood by reading and studying the following specification.

In one embodiment, an electronic device is provided. The electronic device includes a circuit board. A first circuit is disposed on a first side of the circuit board. The first circuit is connected to a first ground plane of the circuit board. A second circuit is disposed on a second side of the circuit board. The second side is opposite the first side, and the second circuit is connected to a second ground plane of the circuit board. Moreover, the first and second ground planes respectively lie in different planes of the circuit board and are electrically interconnected by a conductive trace disposed within the circuit board.

In another embodiment, a switch-mode power supply is provided. The switch-mode power supply has a circuit board. A power loop is disposed on a first side of the circuit board. The power loop is connected to a first ground plane of the circuit board. A control circuit is disposed on a second side of the circuit board. The second side is opposite the first side, and the control circuit is connected to a second ground plane of the circuit board. In addition, the control circuit is adapted to control the switch-mode power supply. The first and second ground planes respectively lie in different planes of the circuit board and are electrically interconnected by a conductive trace disposed within the circuit board.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention reduce noise that is transmitted by a power loop of a switch-mode power supply to other circuitry within the switch-mode power supply, such as a sensitive control circuit for controlling the switch-mode power supply. This involves locating the power loop and the other circuitry on opposite sides of a circuit board and respectively connecting the power loop and the other circuitry to electrically interconnected ground planes lying in different planes of the circuit board. This reduces the interference transmitted from the power loop to the other circuitry compared to when the other circuitry and the power loop are located on the same side of the circuit board and/or are connected to the same ground plane.

Figure 1:
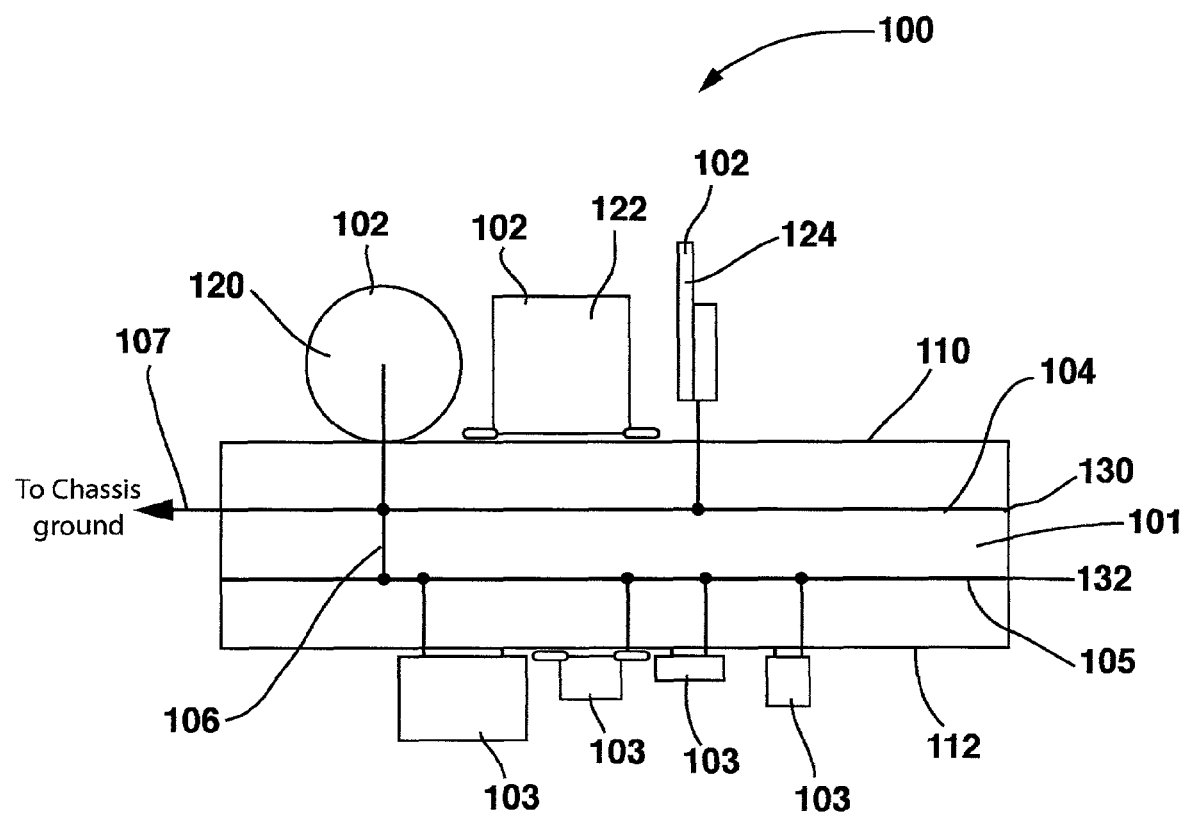
FIG. 1 illustrates an embodiment of a switch-mode power supply according to the teachings of the present invention.

FIG. 1 illustrates an embodiment of a switch-mode power supply 100 according to the teachings of the present invention. In various embodiments, switch-mode power supply 100 is a flyback-type switch-mode power supply, a forward-type switch-mode power supply, or the like. Switch-mode power supply 100 includes a circuit board 101, shown in cross-section in FIG. 1. In one embodiment, circuit board 101 is a printed circuit board. A power loop 102 is disposed on a side (or layer) 110 of circuit board 101. A control circuit 103 is disposed on a side (or layer) 112 of circuit board 101 opposite to side 110. In one embodiment, power loop 102 includes a capacitor 120, an inductor 122, e.g., a primary or secondary winding of a transformer, or the like, and a switch 124, e.g., a MOSFET or the like. In another embodiment, control circuit 103 operates at current levels substantially lower than power loop 102. In some embodiments, control circuit 103 controls power loop 102, for example, by controlling the rate at which switch 124 is opened and closed. In other embodiments, power loop 102 is adapted to power control circuit 103.

Disposing power loop 102 and control circuit 103 on opposite sides of circuit board 101 physically separates power loop 102 from control circuit 103. This reduces interference transmitted from power loop 102 to control circuit 103 compared to when power loop 102 and control circuit 103 are located on the same side of a circuit board.

Power loop 102 is connected to a ground plane 104 disposed on a layer 130 that is disposed between sides 110 and 112 of circuit board 101. Control circuit 103 is connected to a ground plane 105 on a layer 132 that disposed between sides 110 and 112 of circuit board 101 so that ground planes 104 and 105 lie in different planes of circuit board 101 and are physically separated from each other. This reduces the interference transmitted to control circuit 103 compared to when control circuit 103 is connected to the same ground plane as power loop 102. In one embodiment, a conductive trace 106 disposed within circuit board 101 interconnects ground planes 104 and 105. In one embodiment, a conductive trace 107 connects ground planes 104 and 105, for example, to chassis ground.

Figure 2:
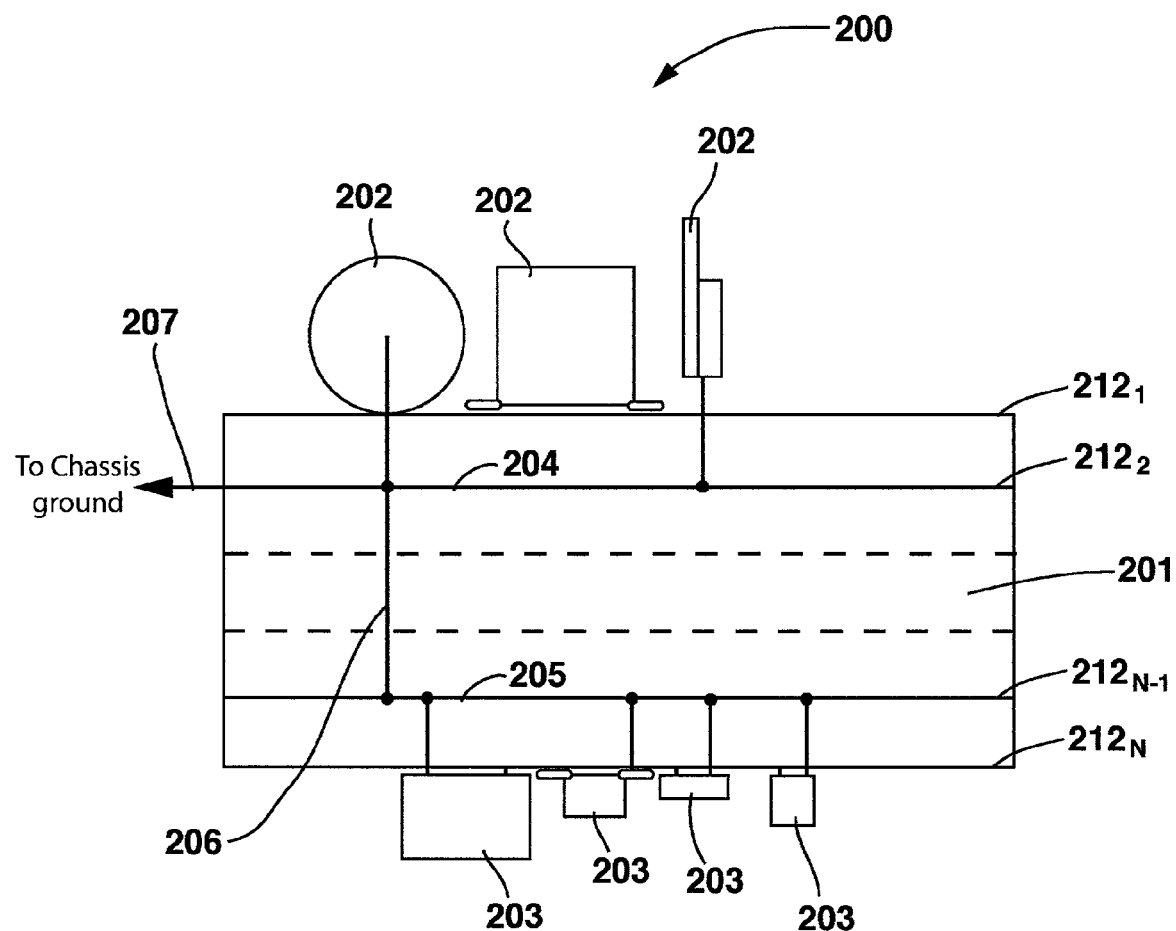
FIG. 2 illustrates another embodiment of a switch-mode power supply according to the teachings of the present invention.

FIG. 2 illustrates a switch-mode power supply 200 according to another embodiment of the present invention. In various embodiments, switch-mode power supply 200 is a flyback-type switch-mode power supply, a forward-type switch-mode power supply, or the like. Switch-mode power supply 200 includes a circuit board 201, shown in cross-section in FIG. 2, having layers $212_1$, to $212_N$. In one embodiment, circuit board 201 is a printed circuit board. A power loop 202 is disposed on layer (or side) $212_1$. A control circuit 203 is disposed on layer (or side) $212_N$. In one embodiment, power loop 202 and control circuit 203 are respectively as described above for power loop 102 and control circuit 103 of FIG. 1.

In one embodiment, power loop 202 is connected to a ground plane 204 of one of layers $212_1$, to $212_N$, e.g., layer $212_2$, of circuit board 201. Control circuit 203, in various embodiments, is connected to a ground plane 205 of another of layers $212_1$, to $212_N$, e.g., layer $212_{N-1}$, of circuit board 201 so that ground planes 204 and 205 lie in different planes of circuit board 201 and are physically separated from each other. In one embodiment, a conductive trace 206 disposed within circuit board 201 interconnects ground planes 204 and 205. In one embodiment, for example, a conductive trace 207 disposed on layer $212_2$ connects ground planes 204 and 205 to chassis ground.

Figure 3:
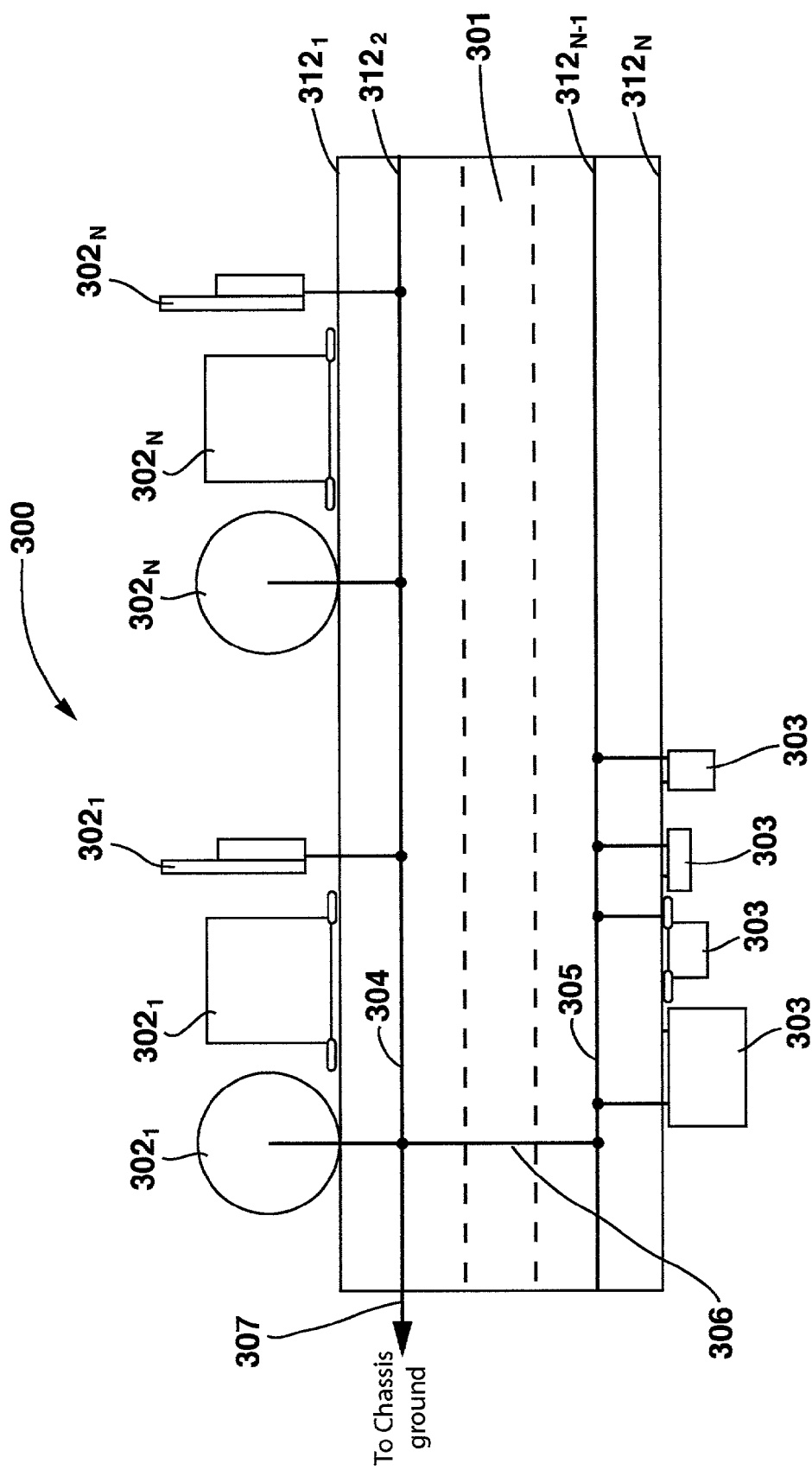
FIG. 3 illustrates yet another embodiment of a switch-mode power supply according to the teachings of the present invention.

FIG. 3 illustrates a switch-mode power supply 300 according to another embodiment of the present invention. In various embodiments, switch-mode power supply 300 is a flyback-type switch-mode power supply, a forward-type switch-mode power supply, or the like. Switch-mode power supply 300 includes a circuit board 301, shown in cross-section in FIG. 3, having layers $312_1$, to $312_N$. In one embodiment, circuit board 301 is a printed circuit board. Power loops $302_1$ to $302_N$ are disposed on layer (or side) $312_1$. A control circuit 303 is disposed on layer (or side) $312_N$. In one embodiment, each of power loops $302_1$, to $302_N$ is as described above for power loop 102 of FIG. 1. In some embodiments, control circuit 303 controls each of power loops $302_1$, to $302_N$. In other embodiments, at least one of power loops $302_1$, to $302_N$ powers control circuit 303.

Each of power loops $302_1$ to $302_N$, in one embodiment, is connected to a ground plane 304 of one of layers $312_1$, to $312_N$, e.g., layer $312_2$, of circuit board 301. Control circuit 303, in various embodiments, is connected to a ground plane 305 of another of layers $312_1$ to $312_N$, e.g., layer $312_{N-1}$, of circuit board 301 so that ground planes 304 and 305 lie in different planes of circuit board 301 and are physically separated from each other. In one embodiment, a conductive trace 306, disposed within circuit board 301 interconnects ground planes 304 and 305. In one embodiment, a conductive trace 307, e.g., disposed in layer $312_2$, connects ground planes 304 and 305 to chassis ground.

CONCLUSION

Embodiments of the present invention have been described. The embodiments reduce the noise that is transmitted from the power loop of a switch-mode power supply to a control circuit of the switch-mode power supply. This involves locating the power loop and the control circuit on opposite sides of a circuit board and respectively connecting the power loop and the control circuit to electrically interconnected ground planes lying in different planes of the circuit board.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, power loop 202 can be grounded on a ground plane of any one of layers $212_1$, to $212_N$ of circuit board 201, while control circuit 203 can be grounded on a ground plane of any of the other layers $212_1$ to $212_N$ of circuit board 201. In one example, power loop 202 can be grounded on a ground plane of layer $212_1$, while control circuit 203 can be grounded on a ground plane of any of the layers $212_2$ to $212_N$. Alternatively, control circuit 203 can be grounded on a ground plane of layer $212_N$ of circuit board 201, while power loop 202 can be grounded on a ground plane of any one of layers $212_1$, to $212_{N-1}$. Similarly, each of power loops $302_1$ to $302_N$ can be grounded on a ground plane of any one of layers $312_1$, to $312_N$ of circuit board 301, while control circuit 303 can be grounded on a ground plane of any of the other layers $312_1$, to $312_N$ of circuit board 301. In one example, each of power loops $302_1$, to $302_N$ can be grounded on a ground plane of layer $312_1$, while control circuit 303 can be grounded on a ground plane of any of the layers $312_2$ to $312_N$. Alternatively, control circuit 303 can be grounded on a ground plane of layer $312_N$ of circuit board 301, while each of power loops $302_1$, to $302_N$ can be grounded on a ground plane of any one of layers $312_1$, to $312_{N-1}$. Switch mode power supply 100 is not limited to a single power loop 102, but rather can have two or more power loops. Also, power loop 102 can be grounded to a ground plane disposed on side 110 of circuit board 101 and control circuit 103 can be grounded on a ground plane disposed on side 112 of circuit board 101. In addition, the present invention is not limited to switch-mode power supplies and control circuits for controlling switch-mode power supplies. Rather, the present invention can be used for any electronic device that has electrical circuits that generate noise that can interfere with the operation of sensitive electrical circuits of the device.

What is claimed is:

1. An electronic device comprising:
   a circuit board;
   a first circuit disposed on a first side of the circuit board, the first circuit connected to a first ground plane of the circuit board;
   a second circuit disposed on a second side of the circuit board, wherein the second side is opposite the first side, the second circuit connected to a second ground plane of the circuit board; and
   wherein the first and second ground planes respectively lie in different planes of the circuit board and are electrically interconnected by a conductive trace disposed within the circuit board; and
   wherein the second circuit operates at current levels substantially lower than the first circuit.

2. The electronic device of claim 1, wherein the first circuit is a switch-mode power supply.

3. The electronic device of claim 1, wherein the second circuit controls the first circuit.

4. The electronic device of claim 1, wherein the first circuit is adapted to power the second circuit.

5. The electronic device of claim 1, wherein the first ground plane is disposed on the first side of the circuit board.

6. The electronic device of claim 1, wherein the second ground plane is disposed on the second side of the circuit board.

7. The electronic device of claim 1, wherein the first circuit comprises a plurality of switch-mode power supply power loops.

8. The electronic device of claim 1, wherein the circuit board comprises two or more layers disposed between the first and second sides.

9. The electronic device of claim 1, wherein the circuit board comprises one or more layers disposed between the first and second sides.

10. The electronic device of claim 2, wherein the switch-mode power supply is a forward-type switch mode power supply.

11. The electronic device of claim 2, wherein the switch-mode power supply is a flyback-type switch mode power supply.

12. The electronic device of claim 11, wherein the first ground plane is disposed on one of the two or more layers and the second ground plane is disposed on another of the two or more layers.

13. The electronic device of claim 9, wherein the first ground plane is disposed on one of the one or more layers and the second ground plane is disposed on the second side of the circuit board.

14. The electronic device of claim 9, wherein the first ground plane is disposed on the first side of the circuit board and the second ground plane is disposed on one of the one or more layers.

15. A switch-mode power supply comprising:
    a circuit board;
    a power loop disposed on a first side of the circuit board, the power loop connected to a first ground plane of the circuit board;
    a control circuit disposed on a second side of the circuit board, the second side opposite the first side, the control circuit connected to a second ground plane of the circuit board, wherein the control circuit is adapted to control the power loop; and
    wherein the first and second ground planes respectively lie in different planes of the circuit board and are electrically interconnected by a conductive trace disposed within the circuit board; and
    wherein the control circuit operates at current levels substantially lower than the power loop.

16. The switch-mode power supply of claim 15, wherein the power loop is adapted to power the control circuit.

17. The switch-mode power supply of claim 15, wherein the first ground plane is disposed on the first side of the circuit board.

18. The switch-mode power supply of claim 15, wherein the second ground plane is disposed on the second side of the circuit board.

19. The switch-mode power supply of claim 15, wherein the power loop comprises a plurality of power loops.

20. The switch-mode power supply of claim 15, wherein the circuit board comprises two or more layers disposed between the first and second sides.

21. The switch-mode power supply of claim 15, wherein the circuit board comprises one or more layers disposed between the first and second sides.

22. The switch-mode power supply of claim 20, wherein the first ground plane is disposed on one of the two or more layers and the second ground plane is disposed on another of the two or more layers.

23. The switch-mode power supply of claim 21, wherein the first ground plane is disposed on one of the one or more layers and the second ground plane is disposed on the second side of the circuit board.

24. The switch-mode power supply of claim 21, wherein the first ground plane is disposed on the first side of the circuit board and the second ground plane is disposed on one of the one or more layers.

* * * * *